United States Patent
Salim et al.

(10) Patent No.: US 11,687,042 B2
(45) Date of Patent: Jun. 27, 2023

(54) FREQUENCY MODULATION SPECTROSCOPY WITH LOCALIZED FLUORESCENCE

(71) Applicant: ColdQuanta, Inc., Boulder, CO (US)

(72) Inventors: Evan Salim, Lafayette, CO (US); Judith Olson, Northglenn, CO (US); Andrew Kortyna, Boulder, CO (US); Dina Genkina, Hyattsville, MD (US); Flavio Cruz, Superior, CO (US)

(73) Assignee: ColdQuanta, Inc., Boulder, CO (US)

( * ) Notice: Subject to any disclaimer, the term of this patent is extended or adjusted under 35 U.S.C. 154(b) by 0 days.

(21) Appl. No.: 17/695,986

(22) Filed: Mar. 16, 2022

(65) Prior Publication Data

US 2022/0393691 A1     Dec. 8, 2022

Related U.S. Application Data

(60) Provisional application No. 63/197,375, filed on Jun. 5, 2021.

(51) Int. Cl.
*G04F 5/14* (2006.01)
*H03L 7/26* (2006.01)
*G01N 21/64* (2006.01)

(52) U.S. Cl.
CPC ........... *G04F 5/145* (2013.01); *G01N 21/645* (2013.01); *G04F 5/14* (2013.01); *H03L 7/26* (2013.01); *G01N 2021/6471* (2013.01)

(58) Field of Classification Search
CPC .................................................. G04F 5/145
USPC ...................................................... 331/94.1
See application file for complete search history.

(56) References Cited

U.S. PATENT DOCUMENTS

| 4,912,716 A * | 3/1990 | Mead | H01S 3/1303 372/18 |
| 5,548,124 A * | 8/1996 | Takeshima | G01N 21/6408 356/318 |
| 8,780,948 B2 * | 7/2014 | Wilkinson | H01S 3/13 372/18 |

(Continued)

OTHER PUBLICATIONS

Author Unknown, FM Spectroscopy with Tunable Diode Lasers, Mar. 1, 2022, pp. 1-8.

(Continued)

*Primary Examiner* — Joseph Chang
(74) *Attorney, Agent, or Firm* — Van Pelt, Yi & James LLP; Clifton Leon Anderson

(57) ABSTRACT

A frequency-modulated spectrometry (FMS) output is used to stabilize an atomic clock by serving as an error signal to regulate the clock's oscillator frequency. Rubidium 87 atoms are localized within a hermetically sealed cell using an optical (e.g., magneto-optical) trap. The oscillator output is modulated by a sinusoidal radio frequency signal and the modulated signal is then frequency doubled to provide a modulated 788 nm probe signal. The probe signal excites the atoms, so they emit 775.8 nm fluorescence. A spectral filter is used to block 788 nm scatter from reaching a photodetector, but also blocks 775.8 nm fluorescence with an angle of incidence larger than 8° relative to a perpendicular to the spectral filter. The localized atoms lie within a conical volume defined by the 8° effective angle of incidence so an FMS output with a high signal-to-noise ratio is obtained.

20 Claims, 4 Drawing Sheets

(56) References Cited

U.S. PATENT DOCUMENTS 10,340,658 B1   7/2019  Boyd

OTHER PUBLICATIONS

Martin et al., Compact Optical Atomic Clock Based on a Two-Photon Transition in Rubidium, Mar. 28, 2019, pp. 1-10.

* cited by examiner

US 11,687,042 B2

FREQUENCY MODULATION SPECTROSCOPY WITH LOCALIZED FLUORESCENCE

BACKGROUND

Advances in frequency modulated spectroscopy (FMS) have reduced noise to a level approaching the quantum limits for detection. However, in the context of FMS based on fluorescence (e.g., as opposed to absorption), scatter from excitation beams can contribute noise to the fluorescence detection. Spectral filtering can mitigate this noise but has limitations when the excitation wavelengths are close to, e.g., within a few nanometers of, the fluorescence wavelength. What is needed is a way to achieve lower noise level in cases where the excitation wavelength is close to the fluorescence wavelength.

DETAILED DESCRIPTION

The present invention provides for enhanced frequency modulation spectroscopy based on fluorescence from a molecular entity (e.g., atom) vapor where background noise includes wavelengths close to that of the fluorescence. More specifically, an optical (all-optical or magneto-optical) trap is used to localize molecular entities within a narrow angle required by some spectral filters to effectively distinguish wavelengths near to a wavelength to be detected. In embodiments in which there are no other detectable fluorescence wavelengths, this localization enables fluorescence detection where otherwise there would be none. In embodiments in which there are more readily detectable fluorescence wavelengths, this localization provides for higher signal-to-noise (S/N) frequency modulation spectroscopy. In the context of an atomic clock, the higher S/N provides for more effective oscillator regulation and thus a more stable time keeping.

Figure 1:
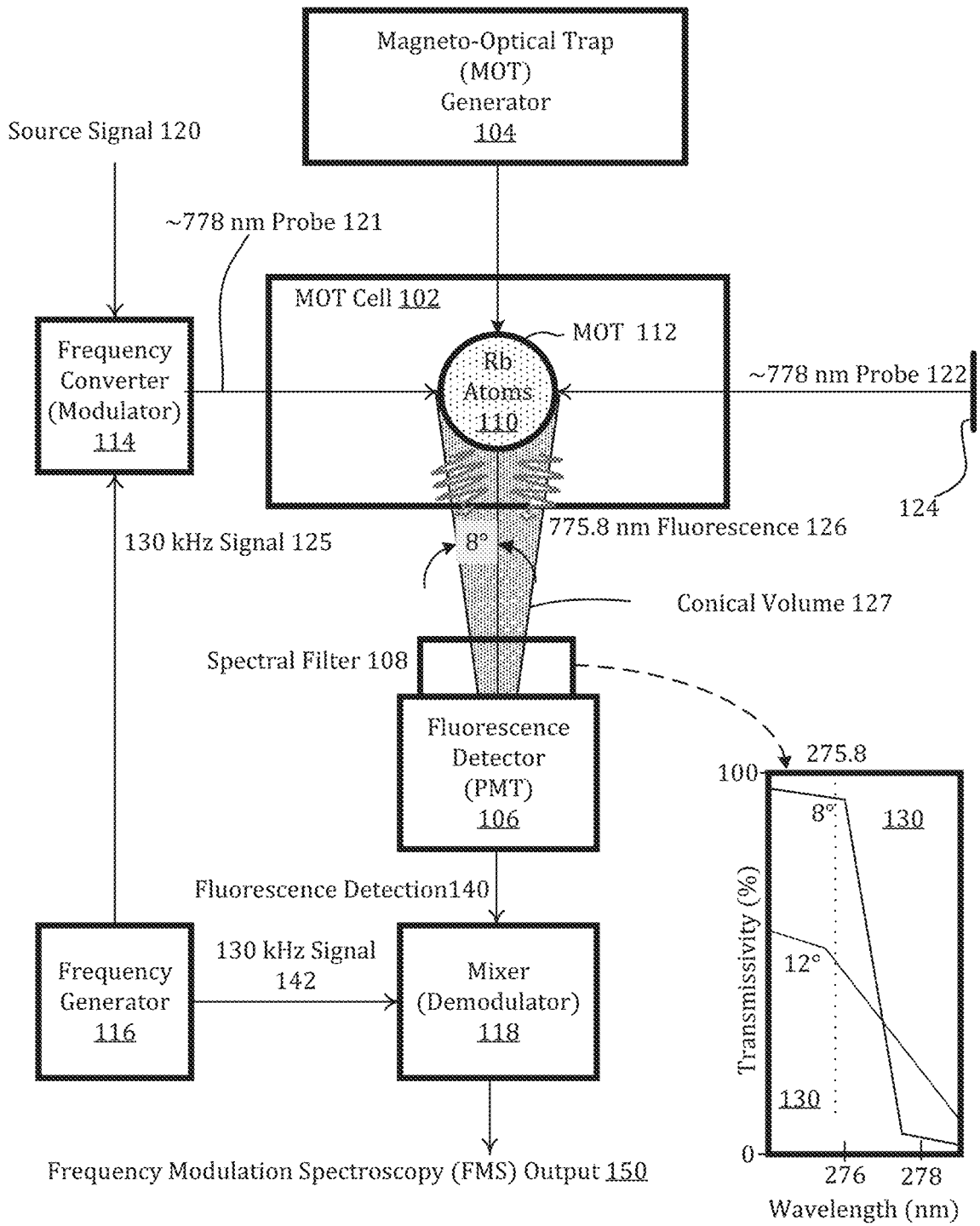
FIG. 1 is a schematic illustration of a frequency modulation spectroscopy system.

For example, a frequency modulation spectroscopy system 100, shown in FIG. 1, includes a magneto-optical trap (MOT) cell 102, a MOT generator 104, a fluorescence detector 106, a spectral filter 108, a frequency converter/modulator 114, a very high frequency (VHF) generator 116, and a mixer/demodulator 118. Hermetically sealed MOT cell 102 is initially filled with rubidium 87 ($^{87}$Rb) atoms 110. MOT generator 104 cools and traps atoms 110 in a MOT 112 so as to localize them with cell 102. In alternative embodiments, other traps, e.g., all-optical traps, are used to localize $^{87}$Rb atoms, other atoms, or other molecular entities (e.g., polyatomic molecules) to such a subregion of a cell. The volume of the subregion is less than one-tenth the interior volume of the cell.

Once localized by trap 112, atoms 110 are excited from a ground state to an excited state using a set of one or more probe beams. Probe beam 121 is derived from a 1556 nm source signal 120. Frequency converter 114 modulates source signal 120 using a sinusoidal 130-kilahertz (2306 meters wavelength) signal 125 generated by low frequency signal generator 116. The modulated source signal is then frequency doubled to yield probe 121. Due to this frequency doubling, probe signal 121 is effectively frequency modulated at 260 Mhz.

In the system 100, two counter-propagating probe beams 121 and 122 with wavelengths of about 778 nm are used for Doppler-free excitation of the atoms. Probe beam 122 results from a reflection of probe beam 121 off of a cats-eye retro-reflector 124. The percentage of atoms 110 that are excited is highest when the probe beam wavelength is 778.1 nm and is lower to the extent that the probe wavelength deviates from 778.1. In alternative embodiments, a second probe beam is not a reflection of a first probe beam, only a single probe beam is used, or three or more probe beams are used. In the illustrated embodiment, the probe beams have the same wavelength; other embodiments use plural probe beams of different wavelengths.

Once excited, atoms 110 spontaneously decay to their original ground state, emitting fluorescence in the process. Most of the decaying atoms emit fluorescence 126 consisting of photons with wavelengths of 775.8 nm. Fluorescence detector 106 is configured to detect incident 775.8 nm photons. Fluorescence is omnidirectional, so not all emitted photons with wavelength 775.8 nm reach fluorescence detector 106; as a result, signal-to-noise ratio (S/N) is a concern, especially considering the presence of spectrally near 778 nm background noise resulting from scattering of the probe wavelengths.

Spectral filter 108 is used to reject 778 nm scatter (from the probe beams) while transmitting 775.8 nm fluorescence. A graph 130 of transmissivity vs. wavelength is plotted for angles of incidence of 8° and 12°. These plots show effective transmission of the 775.8 nm wavelength incident within 8° of perpendicular to spectral filter 108, but significantly less effective 775.8 nm transmission near 12°, so that the resulting detection signal can have a substantial noise component due to detection of scatter from probe beams 121 and 122. By using an atom trap 112 to localize fluorescence sources to a small subregion within an 8° conical volume 127, the present invention increases the percentage of 775.8 nm fluorescence transmitted by spectral filter 108.

The fluorescence transmitted by spectral filter 108 is detected by fluorescence detector 106. Fluorescence detector 106 is a photomultiplier tube (PMT) with a 5 nanoamp (nA) dark current. This PMT provides a fast temporal response and high electron-multiplying gain. A fluorescence detection signal 140 results from fluorescence photons incident fluorescence detector 106. As fluorescence detection signal 140 modulates at 260 MHz, mixer/demodulator 118 demodulates fluorescence detection signal 140 by mixing it with a sinusoidal 130 kHz signal 142 from frequency generator 116 to provide FSM output 150. Since the effective modulation of probe beam 121 is 260 kHz and the demodulation frequency is half that at 130 kHz, the FSM is actually "frequency doubled FSM", aka "2XFSM".

Figure 2:
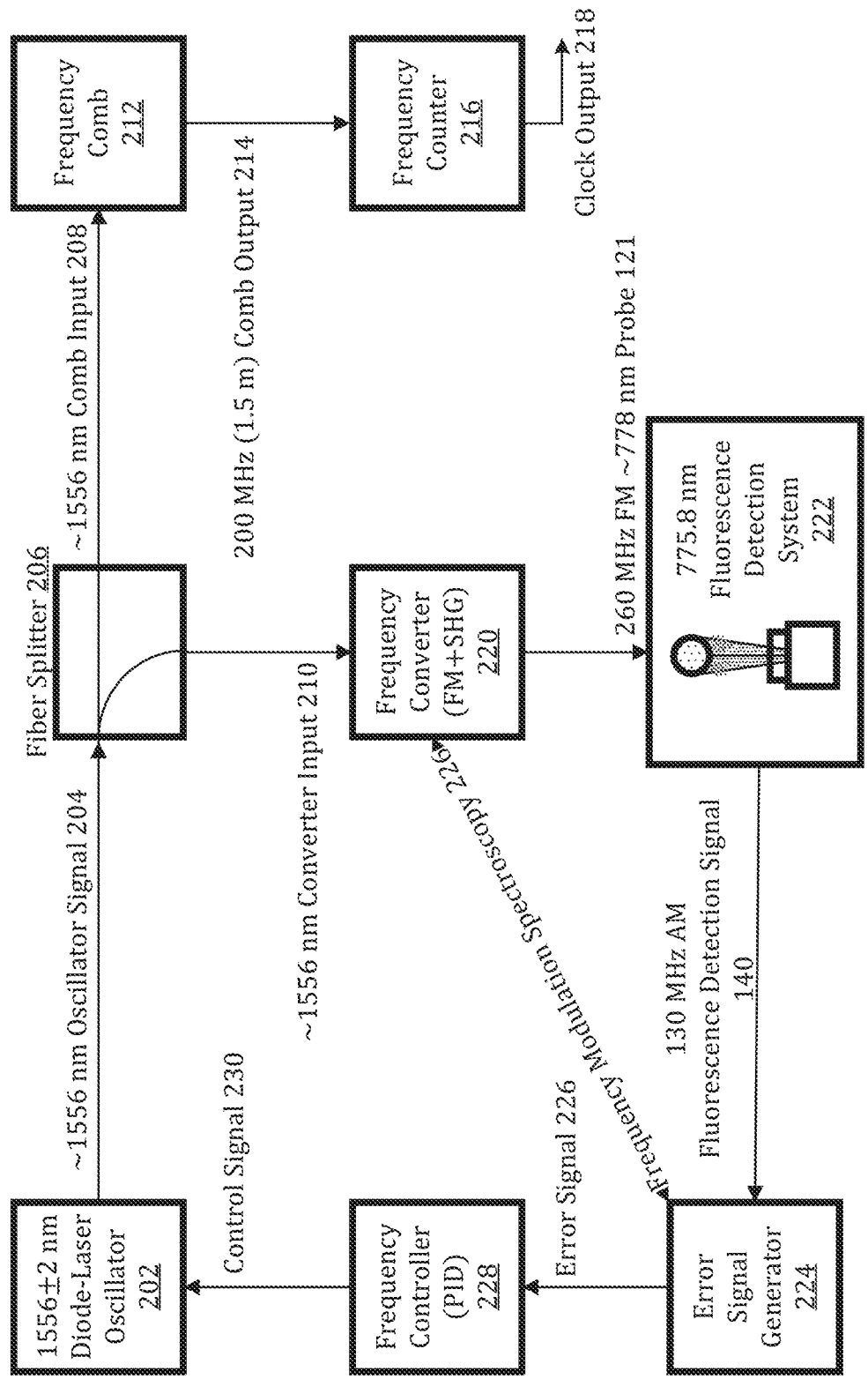
FIG. 2 is a schematic illustration of a rubidium optical atomic clock including the frequency modulation spectroscopy system of FIG. 1.

A rubidium optical atomic clock 200, shown in FIG. 2, includes an oscillator 202, which is a diode laser that outputs an optical oscillator signal 204 with 20 milliwatts (mW) of light having wavelength 1556.2±2 nm. This diode laser has a fast linewidth that is significantly below the natural linewidth of the excited clock state ($\Delta\nu \approx 300$ kHz as observed at 778 nm), alleviating the requirement for laser pre-stabilization to a high finesse optical cavity. In FIG. 2, a tilda "~" is used for signals with frequencies and wavelengths that vary with the oscillator frequency.

A fiber splitter 206 splits oscillator signal 204 into a ~1556 nm comb input 208 and a ~1556 nm converter input 210. Comb input 208, which represents a small portion of oscillator signal 204, is input to an erbium fiber frequency comb 212 to form a beat note. Comb filter 212 serves to stabilize clock output 218 as long as the wavelength of oscillator signal 204 remains within a target range. Fully self-referenced frequency comb 212 divides the 385 terahertz (THz) comb input 208 to provide a comb output 214 of about 200 megahertz (corresponding to a radio frequency wavelength of 1.5 meters), which is the pulse repetition rate for frequency comb 212. After stabilization of the optical beat note and carrier envelope offset frequency, comb output 214 is photo-detected and input to a frequency counter 216, which can be a Microsemi 5125A, available from Mercury Systems, Inc. Phase noise is compared to a hydrogen maser reference. Frequency counter 216 provides the clock output 218. The following explains how oscillator 202 is regulated so that oscillator 204 remains within the target range for frequency comb 212.

~1556 nm converter input 210, which represents the larger portion of the output of fiber splitter 206, is input to frequency converter 220. Frequency converter 220 applies an 130 kilohertz (kHz) sinusoidal signal to frequency modulate the —1556 converter input 210 to prepare for frequency modulation spectroscopy (FMS). Frequency converter 210 then frequency doubles the modulated converter input using a second harmonic generator (SHG) to achieve a frequency modulated ~778.1 nm probe signal 121. In view of the doubling, the 130 kHz modulation of 1556 nm source signal 204 results in a probe 121 with a frequency modulation of 260 kHz.

The resulting probe signal 121 is input to fluorescence detection system 222, which, as explained above with reference to FIG. 1, outputs fluorescence detection signal 140 in response. Fluorescence detection system 222 includes MOT cell 102, MOT generator 104, reflector 122, fluorescence detector 106, and spectral filter 108 (FIG. 1). The 260 MHz frequency modulation of probe 121 results in a fluorescence detection signal with a 130 kHz amplitude modulation (AM) component. Error-signal generator 224, which corresponds to mixer/demodulator 118 in FIG. 1, demodulates fluorescence detection signal 140 to obtain a laser detuning dependent error signal 226, which corresponds to FMS output signal 150 of FIG. 1.

A frequency controller 228 generates a control signal 230 based on error signal 226. Control signal 230 is used to adjust the frequency of oscillator signal 204 to maintain it within the target range for frequency comb 212. Frequency controller 228 is a proportional integral differential (PID) controller that takes past, present and future into account when determining desired frequency corrections. The "present" is taken into account by the present value of the error signal. The "past" is taken into account by an integral over recent values of the error signal. The "future" is based on the present derivative of the error signal. The regulation cycle from oscillator 202 to fluorescence detection system 100 to frequency controller 228 is repeated frequently enough that the wavelength of oscillator signal 204 does not deviate beyond the target range of wavelengths that frequency comb requires to maintain a stable clock output 208.

Further implementation details for atomic clock 200 can be gleaned from Kyle W. Martin et al in "Compact Optical Atomic Clock Based on a Two-Photon Transition in Rubidium", arXiv:1903.11231v1 [physics.atom-ph] 27 Mar. 2019, which is incorporated in full herein by reference. Atomic clock 200 differs from the Martin atomic clock in several respects. While Martin detects 420 nm fluorescence and implicitly rejects 775.8 nm fluorescence, atomic clock 200 does the opposite: detecting 775.8 nm fluorescence and rejecting 420 nm fluorescence (although an alternative embodiment detects both wavelengths). Thus, while Martin need only distinguish between wavelengths that are more than 300 nm apart, atomic clock 200 must distinguish between wavelengths only 1 nm to 10 nm part, or, more specifically, about 2.2 nm apart. Thus, Martin's $^{87}$Rb atoms are in the form of a hot vapor distributed through a vapor cell, the atoms of atomic clock 200 are cooled and then localized in a small volume with a cell to make the most of the narrow effective angle of incidence that characterizes the spectral filter used to block 778 nm scatter while transmitting the 775.8 nm fluorescence.

Figure 3:
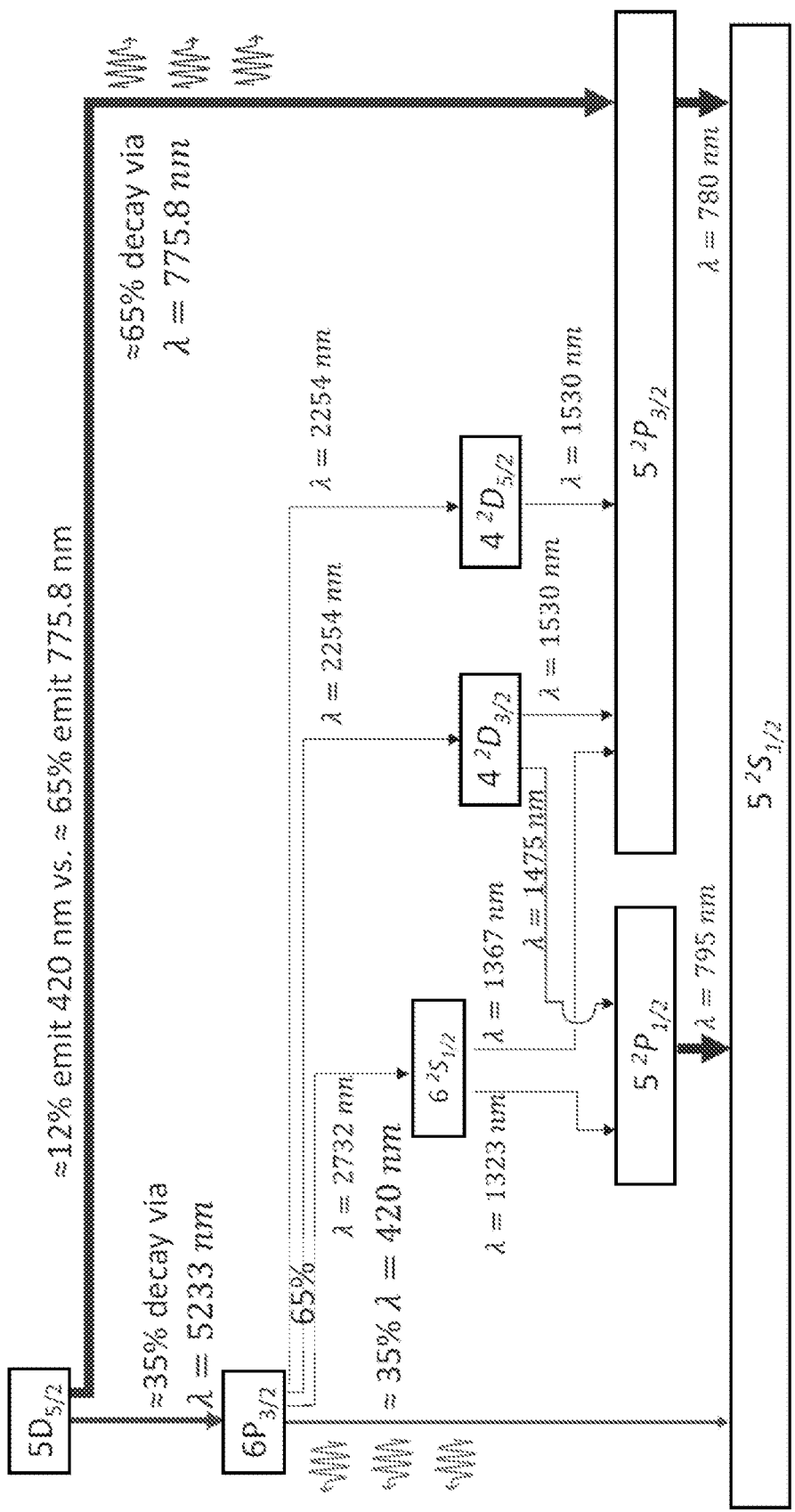
FIG. 3 is a directed graph of rubidium energy levels and transitions therebetween relevant to the fluorescence detection system of FIG. 1.

The advantage of using 775.8 nm fluorescence is apparent from rubidium 87 energy level diagram 300, FIG. 3. Atomic clock 200 uses 778 nm light tuned to a monochromatic two-photon transition to excite $^{87}$Rb atoms from a $5^2D_{1/2}$ ground state to a $5D_{5/2}$ excited state. About 65% of the excited atoms decay to a $5\,_2P_{3/2}$ intermediate state, emitting 775.8 nm fluorescence in the process. This is the fluorescence detected by frequency modulation spectroscopy system 100 and atomic clock 200. The remaining about 35% of excited atoms decay to an intermediate $6P_{3/2}$ energy level, and about 35% of these decay from the $6P_{3/2}$ intermediate energy level to the original $5\,^2D_{1/2}$ ground state, emitting 420 nm fluorescence in the process. Since 35%× 35%=12.25%, only about 12% of the excited atoms provide this 420 nm fluorescence relied upon by Martin et al. The remaining about 65% of atoms at the intermediate $6P_{3/2}$ energy level decay to the $5\,^2D_{1/2}$ ground state through various other intermediate states. Thus, atomic clock 200 stabilizes its oscillator using detection of fluorescence that is five times stronger (in terms of numbers of photons detected) than the 420 nm fluorescence relied on by Martin et al.

Figure 4:
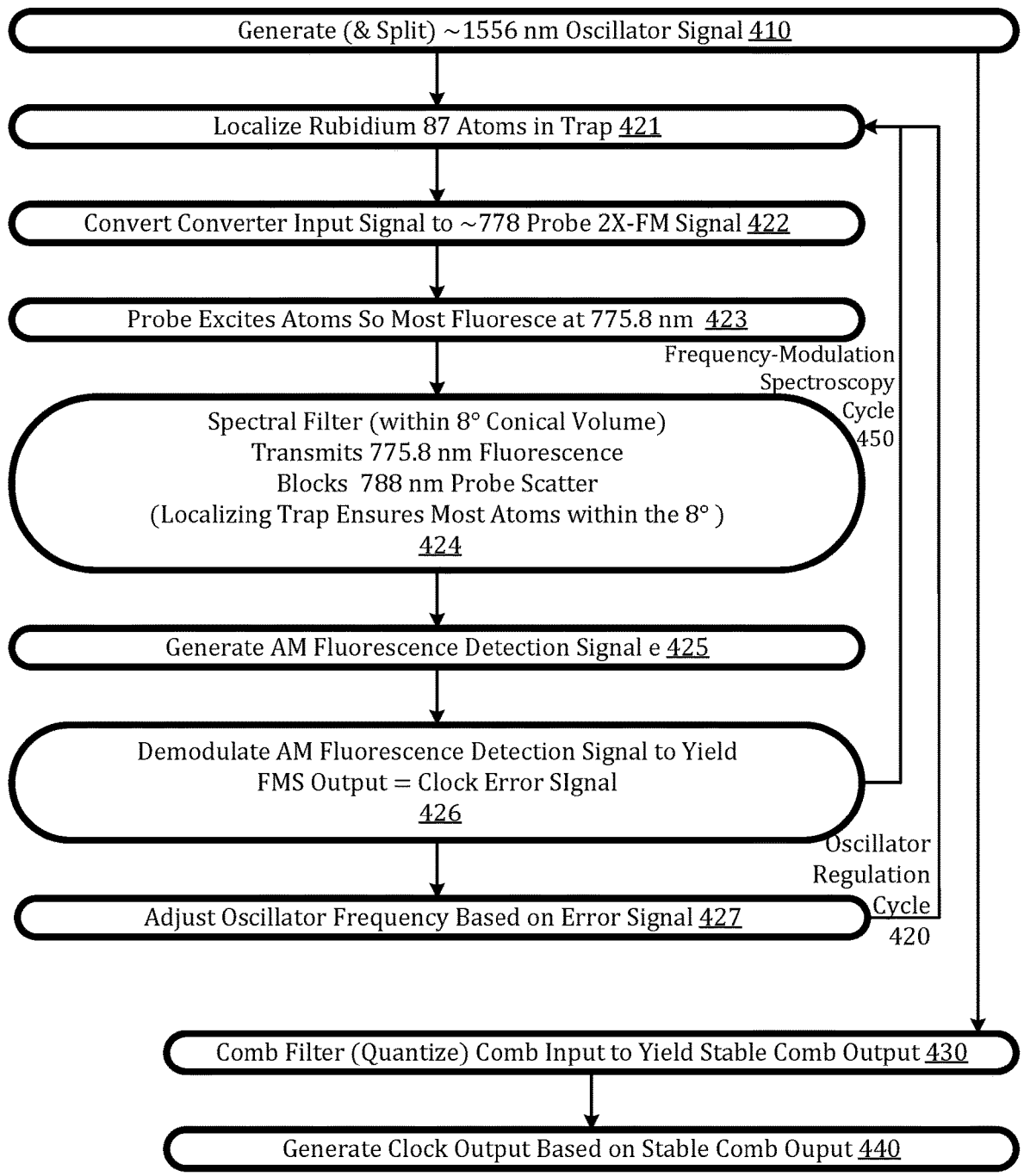
FIG. 4 is a flow chart representing a frequency modulation spectroscopy process implementable in the atomic clock of FIG. 2 and in other systems.

An atomic clock process 400, flow-charted at FIG. 4, is implemented by atomic clock 200 and other atomic clocks. At 410, a ~1556 nm signal is generated and split to yield a comb filter input and a frequency converter input. At 420, a frequency regulation cycle is used to regulate the frequency of the oscillator signal so that the comb input remains within a target range required by a comb filter to provide a stable output. At 430, the comb filter provides a stable comb output signal. At 440, a stable clock output signal is generated based on the stable comb filter output.

Oscillator regulation cycle 420 includes, at 421, cooling and localizing $^{87}$Rb atoms in a trap occupying a volume that is a fraction (e.g., less than ⅒) of the size of a hermetically sealed cell containing the atoms. At 422, the converter input is frequency modulated using a 300 kHz sinusoidal signal and then frequency doubled to yield a ~778 nm FM probe signal. At 423, the probe and a retro-reflected copy of the probe excite the atoms such that most of the excited atoms fluoresce at 775.8 nm.

At 424, a spectral filter transmits 775.8 nm fluorescence while blocking ~788 nm scatter. Commercially available spectral filters can separate these wavelengths, which are only ~2.2 nm apart, provided the beam to be transmitted is perpendicular (i.e., "normal") to the filter or at least within an effective angle of incidence relative to the normal. In atomic clock 200, the effective angle for the wavelengths involved is 8°. In alternative embodiments, the effective angle can be as large as 15°. Accordingly, the localization of atoms at 422 is such that most of the atoms are within a conical volume defined by the effective angle of incidence to ensure effective separation of the 775.8 nm fluorescence from the ~778 nm probe scatter.

The transmitted 775.8 nm fluorescence is collected by a fluorescence detector, which outputs a fluorescence detection signal, at 425. Due to the 260 kHz frequency modulation (FM) of the probe signal, the fluorescence detection signal is characterized by a 130 kHz amplitude modulation (AM). At 426 an error-signal generator demodulates the fluorescence detection signal to yield an error signal that indicates deviations in the oscillator signal from its expected frequency. At 427, a frequency controller adjusts as necessary the frequency of the oscillator signal based on the error signal to maintain the oscillator signal well within the target frequency range of the comb filter. Oscillator regulation cycle 420 is repeated as often or more often than necessary to ensure a stable comb output and thus a stable atomic clock output is based at 440.

Note that actions 421-426 constitute a frequency modulation spectroscopy process with or without the frequency modulation and demodulation. Also note that the localization at 421 is repeated each time the FMS process is repeated, e.g., to monitor the probe frequency and thus the oscillator frequency.

FMS system 100 excites rubidium 87 atoms as sources of fluorescence. Other embodiments use other isotopes of rubidium, other alkali atoms, alkaline metal earth atoms, other atoms, and other molecular entities, e.g., fluorescent molecules. Herein, a "molecular entity" is "any constitutionally or isotopically distinct atom, molecule, ion, ion pair, radical, radical ion, complex, conformer, etc., identifiable as a separately distinguishable entity". The molecular entities of interest herein are those that can assume superpositions of energy levels in response to probe beams and from which they can decay so as to release fluorescence.

Some embodiments use two or more fluorescent species. FMS system 100 uses a magneto-optical trap to localize atoms within a cell. Alternative embodiments use optical lattices, other all-optical traps, and other traps to localize the molecular entities. Herein, an "optical trap" is any trap that traps molecular entities using optical beams; examples include all-optical traps and magneto-optical traps. Fluorescence detection system 100 uses monochromatic 2-photon excitation in which two steps of the transition are interrogated by respective probe photons of the same wavelength. Other embodiments use n-photon transitions, where n is a positive integer. In some embodiments, all probe wavelengths used are the same, while other embodiments employ probes of different wavelengths.

In various embodiments, frequency modulation spectroscopy can be implemented by frequency modulating a converter input with a sub-1 megahertz (MHz) in the process of producing a probe signal and demodulating a resulting fluorescence detection signal by a related frequency. In various embodiments, the probe wavelength can match the oscillator wavelength or can be derived from the oscillator wavelength in various ways. Depending on the embodiment, the spectral filter can be a low frequency pass filter (as used by Martin et al.), a high-frequency pass filter, a notch filter, a bandpass filter, or a combination of these filter types.

Herein, "frequency modulation spectroscopy" or "FMS" is spectrometry technique that involves demodulating an output signal resulting from a modulated probe signal. While FMS is often used for absorption measurements, it is applied herein on fluorescence measurements. Herein, "optical" refers to electro-magnetic radiation with wavelengths from 10 nm to $10^3$ μm, and frequencies in the range from 300 GHz to 3000 THz. Herein, wavelength specifications herein have a tolerance of ±0.5 nm.

Herein, all art labeled "prior art", if any, is admitted prior art; art not labeled "prior art" is not admitted prior art. The illustrated embodiments, variations thereupon, and modifications thereto are provided for by the present invention, the scope of which is defined by the accompanying claims.

What is claimed is:

1. A frequency-modulation spectroscopy process comprising:
   forming an optical trap to localize molecular entities in a subregion of a cell, the subregion having a volume that is less than 1/10 of an internal volume of the cell;
   frequency converting an optical source signal to provide a first probe beam having a first probe wavelength, the frequency conversion including frequency modulating the optical source signal using a radio-frequency signal;
   probing the molecular entities using at least the first probe beam so that the molecular entities emit fluorescence having a first fluorescence wavelength different from the first probe wavelength;
   spectrally filtering the fluorescence using a spectral filter, the spectral filter being characterized by an effective angle of incidence on the spectral filter within which the spectral filter can effectively block the first probe wavelength and transmit the first fluorescence wavelength, the filter being less effective at blocking the first probe wavelength or transmitting the first fluorescence wavelength at angles larger than the effective angle of incidence, at least half of the molecular entities that emit the fluorescence being within a conical volume defined by the effective angle of incidence;
   detecting the spectrally filtered fluorescence transmitted by the spectral filter to provide a fluorescence detection signal; and
   demodulating the fluorescence detection signal so as to provide a frequency-modulation spectroscopy output signal.

2. The frequency-modulation spectroscopy process of claim 1 wherein, in the absence of the optical trap, the molecular entities would be distributed throughout the cell so that fewer than half of the molecular entities would be within the conical volume defined by the effective angle of incidence.

3. The frequency-modulation spectroscopy process of claim 1 wherein the molecular entities are rubidium 87 atoms, the first probe wavelength is 778±.5nanometers, the first fluorescence wavelength is 775.8±.5 nanometers, and the optical trap is a magneto-optical trap or an all-optical trap.

4. The frequency-modulation spectroscopy process of claim 1 wherein the detecting results in the fluorescence detection signal corresponding to a time- varying magnitude of a detected fluorescence.

5. The frequency-modulation spectroscopy process of claim 1 wherein:
   the frequency modulating includes modulating the source signal with a sinusoidal signal having a first radio-frequency below one megahertz so as to provide a modulated optical source signal; and
   the demodulating includes mixing the fluorescence detection signal with a sinusoidal signal having the first radio-frequency.

6. The frequency-modulation spectroscopy process of claim 5 wherein the frequency conversion includes frequency doubling the modulated source signal.

7. The frequency-modulation spectroscopy process of claim 1 wherein the molecular entities are excited by the first probe beam and a retro-reflection of the first probe beam.

8. The frequency-modulation spectroscopy process of claim 1 wherein a first percentage of the molecular entities emits the fluorescence of the first fluorescence wavelength and a second percentage of the molecular entities emits an additional fluorescence of a second fluorescence wavelength, the second percentage being less than half the first percentage, an absolute value of a difference between the second fluorescence wavelength and the first probe wavelength being more than twice an absolute value of a difference between the first fluorescence wavelength and the first probe wavelength.

9. The frequency-modulation spectroscopy process of claim 8 wherein the detecting includes detecting the fluorescence of the first fluorescence wavelength and the additional fluorescence of the second fluorescence wavelengths, the additional fluorescence with the second fluorescence wavelength being transmitted by the spectral filter.

10. The frequency-modulation spectroscopy process of claim 9 wherein the detecting includes detecting the fluorescence of the first fluorescence wavelength but not the additional fluorescence of the second fluorescence wavelength, the additional fluorescence of the second fluorescence wavelength being blocked by the spectral filter.

11. A frequency-modulation spectroscopy system comprising:
an optical trap generator for forming an optical trap to localize molecular entities in a subregion of a cell, the subregion having a volume that is less than 1/10 of an internal volume of the cell;
a frequency converter for frequency converting an optical source signal to provide a first probe beam having a first probe wavelength, the frequency conversion including frequency modulating the optical source signal using a radio-frequency signal, at least the first probe beam probing the molecular entities so that the molecular entities emit fluorescence having a first fluorescence wavelength different from the first probe wavelength;
a spectral filter for spectrally filtering the fluorescence, the spectral filter being characterized by an effective angle of incidence on the spectral filter within which the spectral filter can effectively block the first probe wavelength and transmit the first fluorescence wavelength, the filter being less effective at blocking the first probe wavelength or transmitting the first fluorescence wavelength at angles larger than the effective angle of incidence, at least half of the molecular entities that emit the fluorescence being within a conical volume defined by the effective angle of incidence;
a fluorescence detector for detecting the spectrally filtered fluorescence transmitted by the spectral filter to provide a fluorescence detection signal; and
a demodulator for demodulating the fluorescence detection signal so as to provide a frequency-modulation spectroscopy output signal.

12. The frequency-modulation spectroscopy system of claim 11 wherein, in the absence of the optical trap, the molecular entities would be distributed throughout the cell so that fewer than half of the molecular entities would be within the conical volume defined by the effective angle of incidence.

13. The frequency-modulation spectroscopy system of claim 11 wherein the molecular entities are rubidium 87 atoms, the first probe wavelength is 778±.5 nanometers, the first fluorescence wavelength is 775.8±.5 nanometers, and the optical trap is a magneto-optical trap or an all-optical trap.

14. The frequency-modulation spectroscopy system of claim 11 wherein the detecting results in the fluorescence detection signal corresponding to a time-varying magnitude of a detected fluorescence.

15. The frequency-modulation spectroscopy system of claim 11 wherein:
the frequency modulating includes modulating the optical source signal with a sinusoidal signal having a first radio-frequency below one megahertz so as to provide a modulated source signal; and
the demodulating includes mixing the fluorescence detection signal with a sinusoidal signal having the first radio-frequency.

16. The frequency-modulation spectroscopy system of claim 15 wherein the frequency conversion includes frequency doubling the modulated source signal.

17. The frequency-modulation spectroscopy system of claim 11 wherein the molecular entities are excited by the first probe beam and a retro-reflection of the first probe beam.

18. The frequency-modulation spectroscopy system of claim 11 wherein a first percentage of the molecular entities emits the fluorescence of the first fluorescence wavelength and a second percentage of the molecular entities emits an additional fluorescence of a second fluorescence wavelength, the second percentage being less than half the first percentage, an absolute value of a difference between the second fluorescence wavelength and the first probe wavelength being more than twice an absolute value of a difference between the first fluorescence wavelength and the first probe wavelength.

19. The frequency-modulation spectroscopy system of claim 18 wherein the detecting includes detecting the fluorescence of the first fluorescence wavelength and the additional fluorescence of the second fluorescence wavelengths, the additional fluorescence with the second fluorescence wavelength being transmitted by the spectral filter.

20. The frequency-modulation spectroscopy system of claim 19 wherein the detecting includes detecting the fluorescence of the first fluorescence wavelength but not the additional fluorescence of the second fluorescence wavelength, the additional fluorescence of the second fluorescence wavelength being blocked by the spectral filter.

* * * * *